(12) United States Patent
Park et al.

(10) Patent No.: US 8,957,529 B2
(45) Date of Patent: Feb. 17, 2015

(54) POWER VOLTAGE SUPPLY APPARATUS FOR THREE DIMENSIONAL SEMICONDUCTOR

(71) Applicant: Soongsil University Research Consortium Techno-Park, Seoul (KR)

(72) Inventors: Chang Kun Park, Suwon-si (KR); Ho Yong Hwang, Gyeongsangnam-do (KR)

(73) Assignee: Soongsil University Research Consortium Techno-Park, Seoul (KR)

( * ) Notice: Subject to any disclaimer, the term of this patent is extended or adjusted under 35 U.S.C. 154(b) by 0 days.

(21) Appl. No.: 13/961,011

(22) Filed: Aug. 7, 2013

(65) Prior Publication Data

US 2014/0138798 A1 May 22, 2014

(30) Foreign Application Priority Data

Nov. 19, 2012 (KR) .................. 10-2012-0131050

(51) Int. Cl.
*H01L 29/40* (2006.01)
*H01L 23/538* (2006.01)
*H01L 25/065* (2006.01)

(52) U.S. Cl.
CPC ........ *H01L 23/5384* (2013.01); *H01L 25/0657* (2013.01); *H01L 2224/0401* (2013.01); *H01L 2224/04042* (2013.01); *H01L 2224/0557* (2013.01); *H01L 2224/06181* (2013.01); *H01L 2224/16145* (2013.01); *H01L 2224/16146* (2013.01); *H01L 2224/16225* (2013.01); *H01L 2224/32145* (2013.01); *H01L 2224/32225* (2013.01); *H01L 2224/48227* (2013.01); *H01L 2224/73257* (2013.01); *H01L 2224/73265* (2013.01); *H01L 2224/92247* (2013.01); *H01L 2225/0651* (2013.01); *H01L 2225/06517* (2013.01); *H01L 2225/06513* (2013.01); *H01L 2225/06541* (2013.01); *H01L 2225/06565* (2013.01); *H01L 2225/06562* (2013.01); *H01L 2924/30107* (2013.01)
USPC .......................................... 257/777; 257/621

(58) Field of Classification Search
CPC .............. H01L 23/538; H01L 23/5384; H01L 25/0657
USPC .......... 257/E23.153, 777, 686, 778, E21.137, 257/E27.144, E27.161
See application file for complete search history.

(56) References Cited

U.S. PATENT DOCUMENTS

| 8,168,450 | B2 * | 5/2012 | Choi | 438/14 |
| 2002/0036338 | A1 * | 3/2002 | Matsuo et al. | 257/686 |
| 2007/0181991 | A1 * | 8/2007 | Ishino et al. | 257/686 |
| 2012/0267792 | A1 * | 10/2012 | Takayama et al. | 257/774 |

FOREIGN PATENT DOCUMENTS

KR 10-2012-0000178 A 1/2012

* cited by examiner

Primary Examiner — Armando Rodriguez
Assistant Examiner — Mohammed R Alam
(74) Attorney, Agent, or Firm — Sherr & Jiang, PLLC

(57) ABSTRACT

Provided is a power voltage supply apparatus of a 3-dimensional (3D) semiconductor. The power voltage supply apparatus includes a plurality of integrated circuits (ICs) which each include a first through silicon via (TSV) and a second TSV, are stacked such that the first TSVs are connected and second TSVs are connected, and are mounted on a printed circuit board (PCB), wherein a first PCB line formed on the PCB and supplying a first voltage is connected to a bottom of a first TSV of a bottom IC from among the plurality of ICs, and a second PCB line formed on the PCB and supplying a second voltage is connected to a top of a second TSV of a top IC.

1 Claim, 12 Drawing Sheets (a)

(b)

(c)

(a)

(b)

(a)

(b)

POWER VOLTAGE SUPPLY APPARATUS FOR THREE DIMENSIONAL SEMICONDUCTOR

CROSS-REFERENCE TO RELATED PATENT APPLICATION

This application claims the benefit of Korean Patent Application No. 10-2012-0131050, filed on Nov. 19, 2012, in the Korean Intellectual Property Office, the disclosure of which is incorporated herein in its entirety by reference.

BACKGROUND OF THE INVENTION

1. Field of the Invention

The present invention relates to a power voltage supply apparatus of a 3-dimensional (3D) semiconductor, and more particularly, to a power voltage supply apparatus of a 3D semiconductor, which improves operational performances of integrated circuits (ICs) in a stacked structure.

2. Description of the Related Art

Generally, an integrated circuit (IC) includes a plurality of pads. Such pads output and receive an external signal, and receive a power voltage and a ground voltage.

FIG. 1 is a conceptual view of a general IC. A pad of the IC is connected to an external printed circuit board (PCB) line through a wire bonding, which is referred to as a 2-dimensional (2D) semiconductor technology. A single chip shown in FIG. 1 operates as a part of an entire electronic system via a communication with another chip.

FIG. 2 is a view for describing two ICs of FIG. 1 communicating via the 2D semiconductor technology. Here, the PCB line and a wire on a signal path satisfactorily operate when a communication speed is low, but when the communication speed increases, a signal distortion is generated due to a parasitic component, such as an inductance, a capacitance, or an electric/magnetic coupling between adjacent lines.

Accordingly, a multi-chip package (MCP) technology has been introduced as a 3D semiconductor technology, wherein several chips are formed in a stacked structure. FIG. 3 is conceptual views for describing the MCP technology that is one of general 3D semiconductor technologies. Chips are stacked such that pads of each chip are externally exposed, and the pads communicate with each other via a bonding wire.

According to the MCP technology, a communication speed is improved and a system size is decreased since a path of a PCB line for signal transmission is remarkably decreased compared to the 2D semiconductor technology of FIG. 2, but a length of the bonding wire is increased, and thus an unexpected signal distortion is frequently generated due to an inductance and a magnetic defect by the bonding wire.

Accordingly, a through silicon via (TSV) technology has been introduced. According to the TSV technology, a signal transmission path is provided by forming an electrode vertically penetrating through silicon that is a material for a semiconductor board. A background technology using the TSV technology is disclosed in KR 10-2012-0000178(publication date; 2012.01.02).

FIG. 4 is conceptual views for describing a general TSV technology. Unlike the MCP technology, pads of all chips that are stacked are not externally exposed in the TSV technology, and the pads of each chip are connected to pads of another chip through a via and a bump as shown in a cross-sectional view of FIG. 4. According to the TSV technology, since a bonding wire is fundamentally removed and a PCB line is also removed from a signal transmission path, parasitic components generated by the bonding wire and the PCB line are fundamentally removed, and thus a communication speed may be improved.

FIG. 5 is conceptual views for describing supply of a power voltage and a ground voltage to ICs of FIG. 4. In a right cross-sectional view, a lower pad of a via is not illustrated. A fourth IC 4 at the bottom is connected to a first PCB line 6 by a first lower pad 44, and the first PCB line 6 supplies a power voltage VDD. The fourth IC 4 is connected to a second PCB line 7 by a second lower pad 45, and the second PCB line 7 supplies a ground voltage GND. Accordingly, the fourth IC 4 receives the power voltage VDD through the first lower pad 44, and receives the ground voltage GND through the second lower pad 45.

A first lower pad 34 of a third IC 3 is connected to a first upper pad 41 of the fourth IC 4 through a bump to receive the power voltage VDD, and a second lower pad 35 of the third IC 3 is connected to a second upper pad 42 of the fourth IC 4 through a bump to receive the ground voltage GND. Other ICs are connected to each other in the same manner.

FIG. 6 is diagrams for describing problems of FIG. 5. FIG. 6(a) is an equivalent circuit of a structure of FIG. 5. Reference numerals A1 through A4 and B1 through B4 correspond to nodes of each TSV portion in FIG. 5. FIGS. 6(b) and (c) are graphs showing voltages measured in each node.

The fourth IC 4 directly receives the power voltage VDD through the first PCB line 6, whereas a first IC 1 indirectly receives the power voltage VDD through other ICs, i.e., the second through fourth ICs 2 through 4. Due to parasitic resistance components 16 in a bump and a TSV, the power voltage VDD decreases while passing through the each IC as shown in FIG. 6(b), and thus the power voltage VDD applied to the first IC 1 is lower than the power voltage VDD applied to the fourth IC 4. Also, the ground voltage GND applied to the first IC 1 is higher than the ground voltage GND actually supplied to the fourth IC 4 as shown in FIG. 6(c). Since a voltage level of the power voltage VDD is decreases and a voltage level of the ground voltage GND is increased towards an upper IC, a voltage difference between the power voltage VDD and the ground voltage GND is decreased towards the upper IC. As a result, it is difficult to form ICs having the same voltage difference. When the voltage difference is decreased as such, operational performances of ICs are deteriorated.

SUMMARY OF THE INVENTION

The present invention provides a power voltage supply apparatus of a 3-dimensional (3D) semiconductor, which improves operational performances by matching a voltage difference between a power voltage and a ground voltage on each of integrated circuits (ICs) with respect to the ICs formed in a stacked structure according to a through silicon via (TSV) technology.

According to an aspect of the present invention, there is provided a power voltage supply apparatus of a 3-dimensional (3D) semiconductor, the power voltage supply apparatus including a plurality of integrated circuits (ICs) which each include a first through silicon via (TSV) and a second TSV, are stacked such that first TSVs are connected and second TSVs are connected, and are mounted on a printed circuit board (PCB), wherein a first PCB line formed on the PCB and supplying a first voltage is connected to a bottom of a first TSV of a bottom IC from among the plurality of ICs, and a second PCB line formed on the PCB and supplying a second voltage is connected to a top of a second TSV of a top IC.

The first voltage may be a power voltage or a ground voltage, and the second voltage may be a ground voltage or a power voltage.

The second PCB line may be connected to the top of the second TSV of the top IC through a wire.

A top of the first PCB line and the bottom of the first TSV of the bottom IC may be connected to each other through a bump, and a support corresponding to a height of the bump may be disposed in a space between the bottom of the second TSV of the bottom IC and the PCB.

According to another aspect of the present invention, there is provided a power voltage supply apparatus of a 3-dimensional (3D) semiconductor, the power voltage supply apparatus including a plurality of integrated circuits (ICs) which each include a first through silicon via (TSV), a second TSV, and a third TSV, are stacked such that first TSVs are connected and second TSVs are connected and third TSVs are connected, and are mounted on a printed circuit board (PCB), wherein a first PCB line formed on the PCB and supplying a first voltage may be connected to a bottom of a first TSV of a bottom IC from among the plurality of ICs, a second PCB line formed on the PCB and supplying a second voltage may be connected to a bottom of a third TSV of the bottom IC, and tops of a second TSV and a third TSV of a top IC may be connected to each other by a conductive material.

The first voltage may be a power voltage or a ground voltage, and the second voltage may be a ground voltage or a power voltage.

The conductive material may be a conductive pad for connecting the tops of the second and third TSVs at a top surface of the top IC.

A top of the first PCB line and the bottom of the first TSV of the bottom IC, and a top of the second PCB line and the bottom of third TSV of the bottom IC may be connected by a bump, and a support corresponding to a height of the bump may be disposed in a space between a bottom of a second TSV of the bottom IC and the PCB.

According to another aspect of the present invention, there is provided a power voltage supply apparatus of a 3-dimensional (3D) semiconductor, the power voltage supply apparatus including a plurality of integrated circuits (ICs) which each include a first through silicon via (TSV) and a second TSV, are stacked such that first TSVs are connected and second TSVs are connected, and are mounted on a printed circuit board (PCB), wherein a first PCB line formed on the PCB and supplying a first voltage may be connected to a bottom of a first TSV of a bottom IC from among the plurality of ICs, a second PCB line formed on the PCB and supplying a second voltage may be connected to a bottom of a second TSV of the bottom IC, the first PCB line may be connected to a top of a first TSV of a top IC through a first wire; and the second PCB line may be connected to a top of a second TSV of the top IC through a second wire.

The first voltage may be a power voltage or a ground voltage, and the second voltage may be a ground voltage or a power voltage.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Hereinafter, the present invention will be described more fully with reference to the accompanying drawings, in which exemplary embodiments of the invention are shown.

Figure 7:
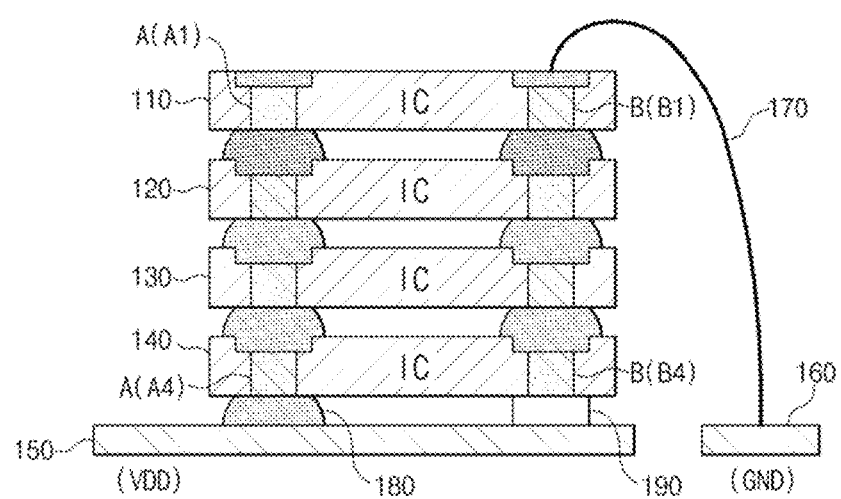
FIG. 7 is a cross-sectional view of a power voltage supply apparatus of a 3D semiconductor, according to an embodiment of the present invention.

FIG. 7 is a cross-sectional view of a power voltage supply apparatus of a 3-dimensional (3D) semiconductor, according to an embodiment of the present invention. Here, a plurality of integrated circuits (ICs) 110, 120, 130, and 140 are mounted on a printed circuit board (PCB) (not shown), and have a stacked structure according to a through silicon via (TSV) method.

The ICs 110 through 140 each include a first TSV A and a second TSV B for the stacked structure, and are stacked such that the first TSVs A are connected and the second TSVs B are connected through a bump. In FIG. 7, one first TSV A and one second TSV B are formed in each of the ICs 110 through 140, but a plurality of the first TSVs and a plurality of the second TSVs may be formed in each of the ICs 110 through 140.

A first PCB line 150 for supplying a first voltage and a second PCB line 160 for supplying a second voltage may be formed on the PCB. In the current embodiment, the first voltage supplied by the first PCB line 150 is a power voltage VDD and the second voltage supplied by the second PCB line 160 is a ground voltage GND.

Here, the first PCB line 150 is connected to a bottom (or a lower pad) of a first TSV A4 of the bottom IC 140 from among the ICs 110 through 140. In detail, a top of the first PCB line 150 is connected to the bottom of the first TSV A4 of the bottom IC 140 through a bump 180. Also, the second PCB line 160 is connected to a top (or an upper pad) of a second TSV B1 of the top IC 110 through a bonding wire 170.

A support 190 corresponding to a height of the bump 180 is disposed in a space between a bottom of a second TSV B4 of the bottom IC 140 and the PCB. The support 190 may support the space and reinforce structural stability, and may be formed of an insulation material that does not have electric conductivity. In FIG. 7, the support 190 is disposed on the first PCB line 150, but alternatively, the support 190 may be disposed on an dielectric material forming the PCB or on another type of signal line.

Figure 8:
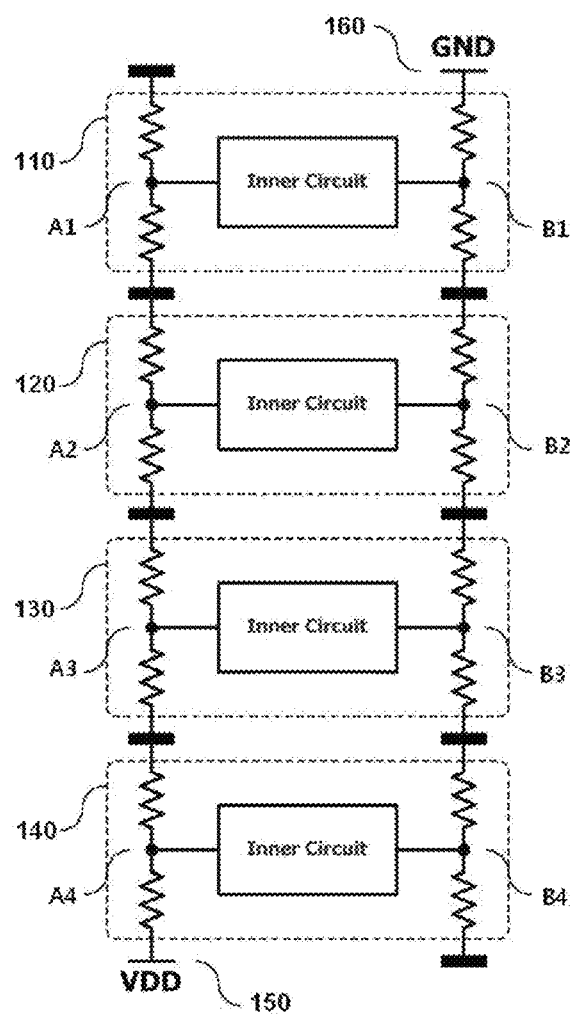
FIG. 8 is diagrams for describing voltage characteristics of each IC according to the power voltage supply apparatus of FIG. 7.
Figure 8:
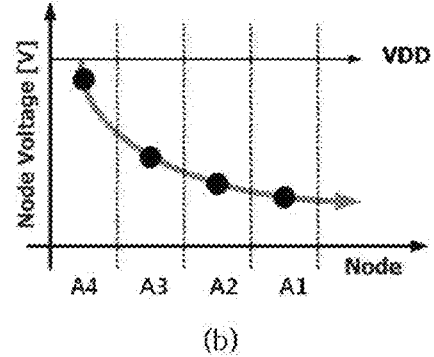
Figure 8:
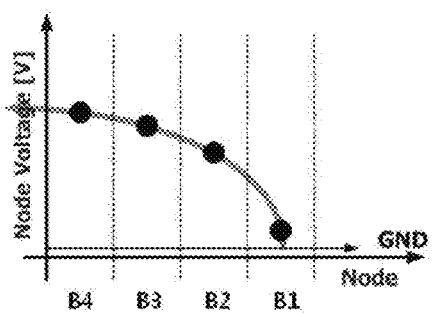

FIG. 8 is diagrams for describing voltage characteristics of each IC according to the power voltage supply apparatus of FIG. 7. FIG. 8(a) is an equivalent circuit of a structure of the power voltage supply apparatus of FIG. 7, wherein reference numerals A1 through A4 correspond to nodes of a first TSV portion of each layer in FIG. 7 and reference numerals B1 through B4 correspond to nodes of a second TSV portion of each layer. FIG. 8(b) is a graph showing the power voltage VDD measured in the nodes A1 through A4 according to the ICs 110 through 140, and FIG. 8(c) is a graph showing the ground voltage GND measured in the nodes B1 through B4 according to the ICs 110 through 140.

In the current embodiment, since the power voltage VDD is directly connected to the first TSV A4 of the bottom IC, the top IC 110 receives the power voltage VDD through the ICs 120 through 140 therebelow. Accordingly, a voltage level of the power voltage VDD in the ICs 110 through 140 is decreased towards the top IC 110 as shown in FIG. 8(b).

Figure 1:
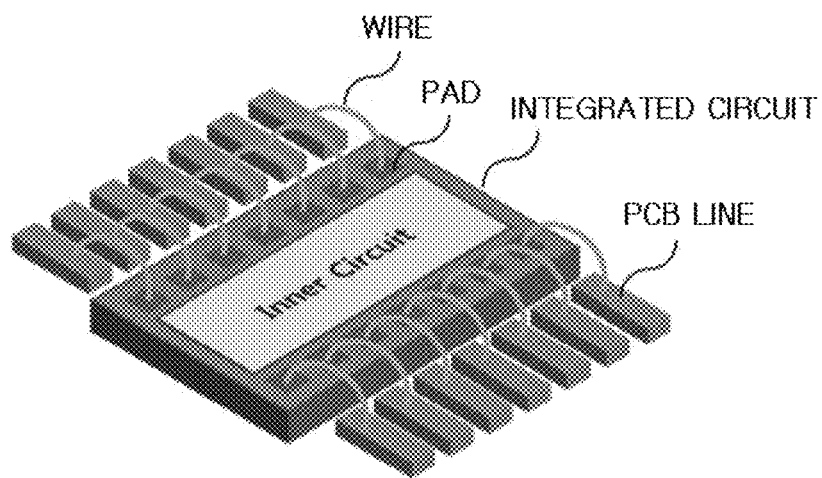
FIG. 1 is a conceptual view of a general integrated circuit (IC)
Figure 2:
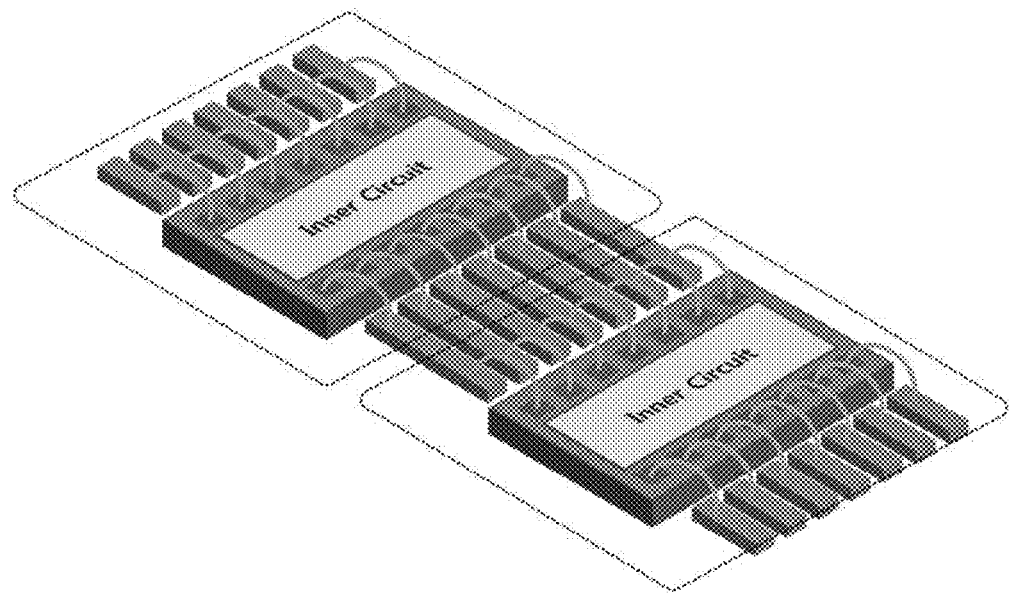
FIG. 2 is a view for describing two ICs of FIG. 1 communicating via a 2-dimensional (2D) semiconductor technology.
Figure 3:
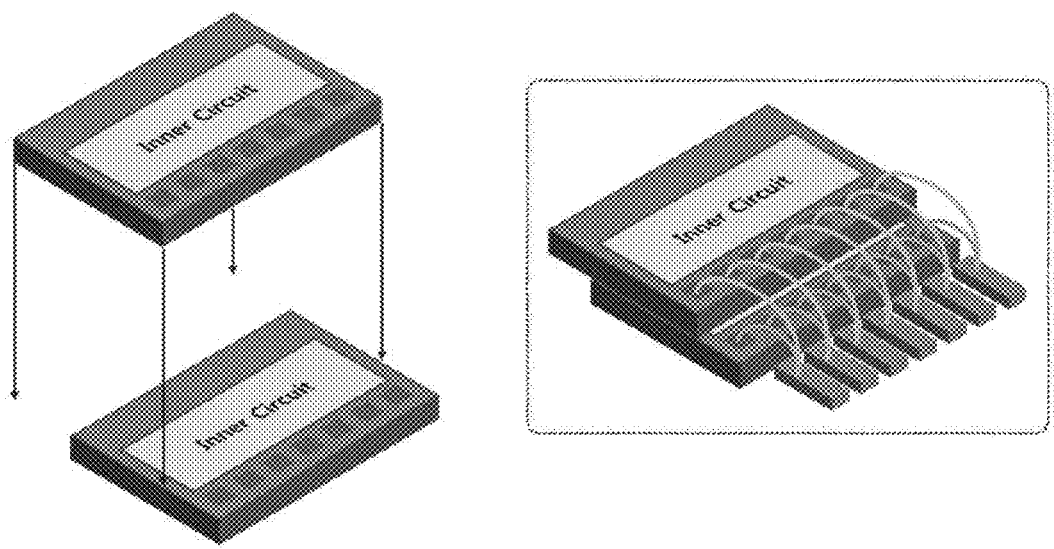
FIG. 3 is conceptual views for describing a multi-chip package (MCP) technology that is one of general 3D semiconductor technologies.
Figure 4:
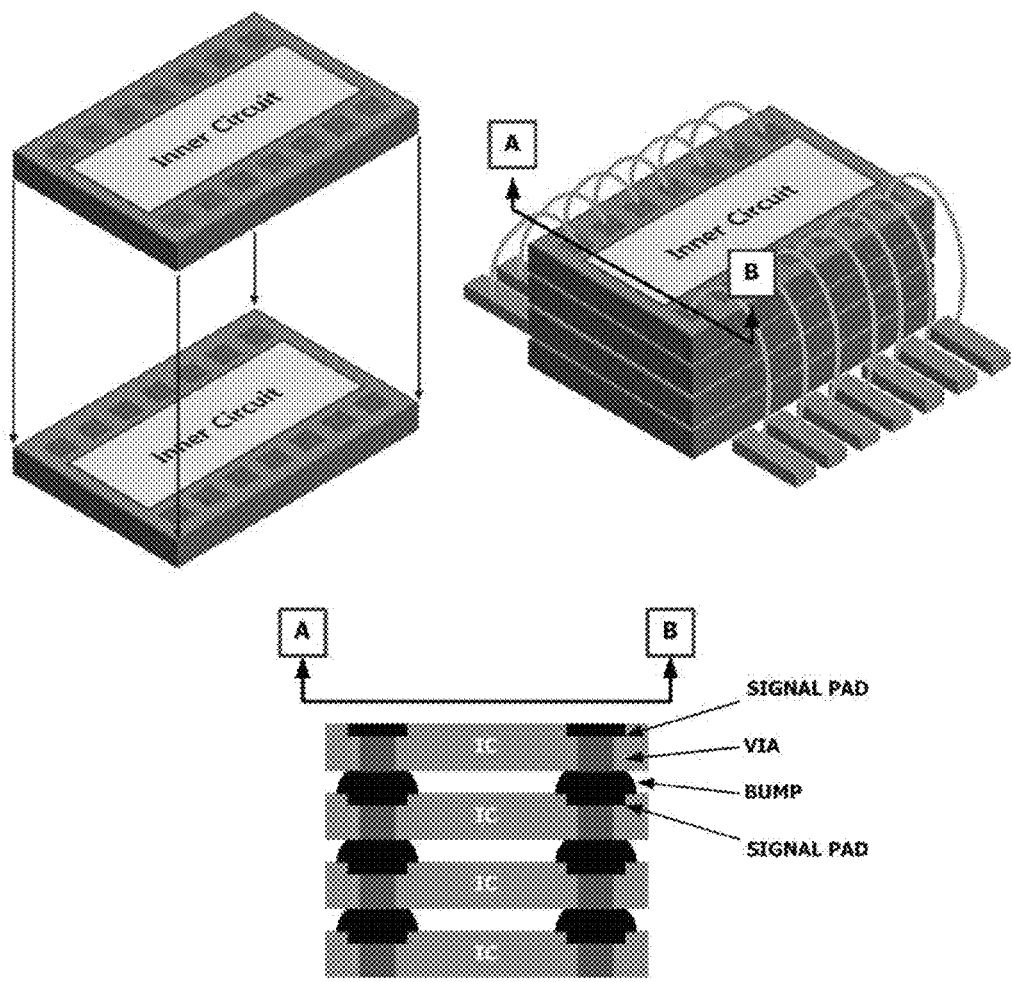
FIG. 4 is conceptual views for describing a general through silicon via (TSV) technology.
Figure 5:
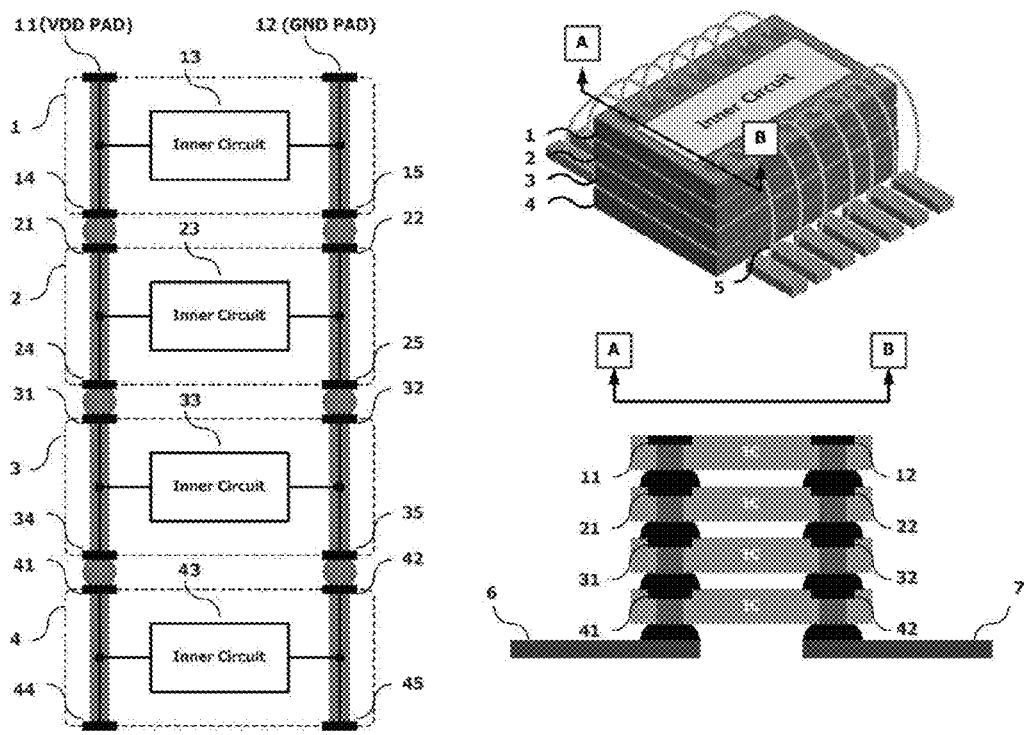
FIG. 5 is conceptual views for describing supply of a power voltage and a ground voltage to an IC of FIG. 4.
Figure 6:
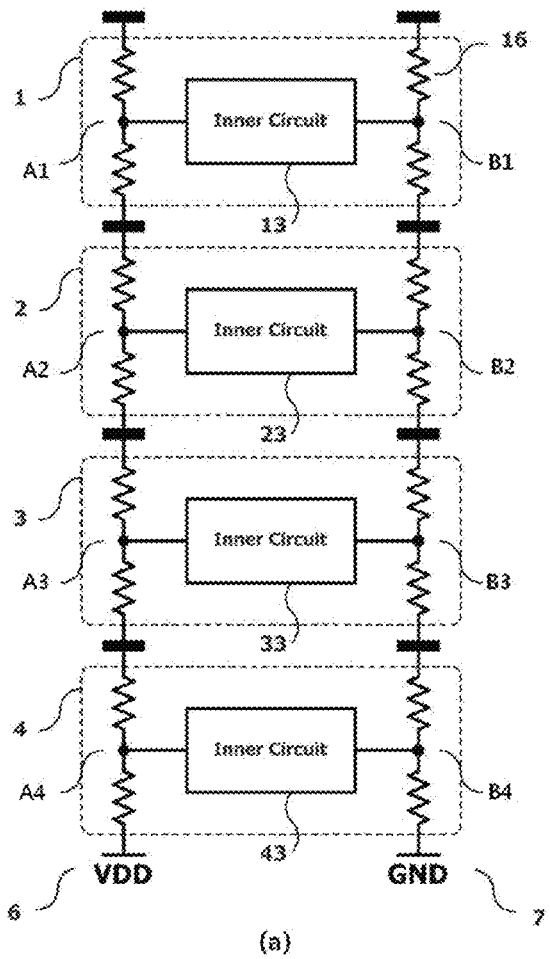
FIG. 6 is diagrams for describing problems of FIG. 5.
Figure 6:
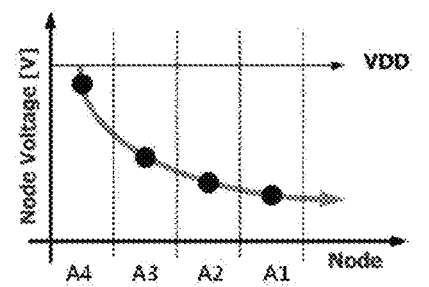
Figure 6:
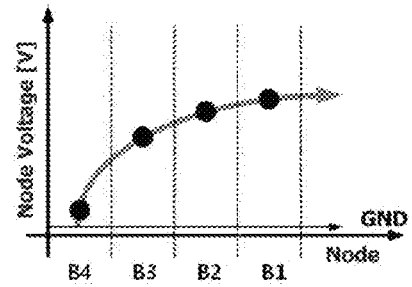

Also, since the ground voltage GND is directly connected to the second TSV B1 of the top IC 110, a ground node of the bottom IC 140 is connected through the ICs 110 through 130 thereabove. Accordingly, a voltage level of the ground voltage GND in the ICs 110 through 140 is increased towards the bottom IC 140 as shown in FIG. 8(c) because a voltage level of the ground voltage GND is increased as a distance from a point where an actual ground voltage GND is applied. Such characteristics are distinct compared to those shown in FIG. 6 showing voltage characteristics according to a structure of FIG. 5. In the structure of FIG. 5, a voltage difference between a power voltage and a ground voltage is reduced towards an upper IC as shown in FIG. 6.

Thus, according to the embodiment of FIG. 7, although the voltage levels of the power voltage VDD and the ground voltage GND are different according to the ICs 110 through 140, 'a voltage difference between a power voltage and a ground voltage' may be relatively uniformly maintained in each IC compared to FIG. 5. Thus, a difference between operational performances of the ICs 110 through 140 is reduced, and an operational performance of an entire system may be improved.

Figure 9:
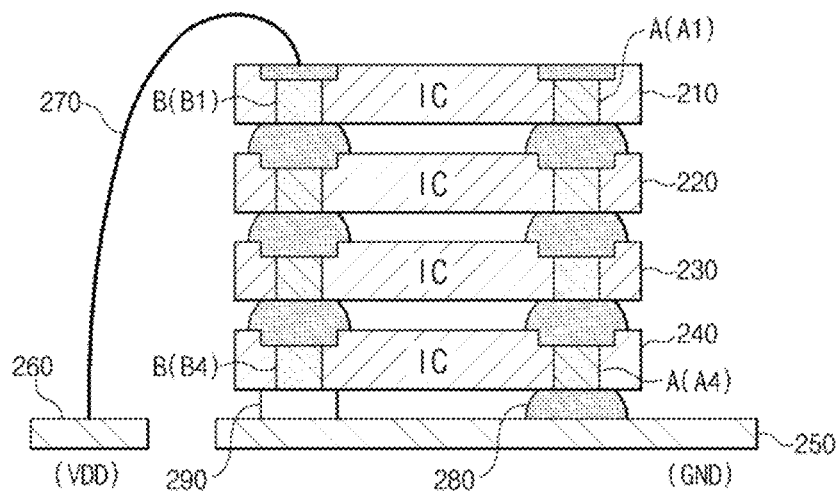
FIG. 9 is a cross-sectional view of a power voltage supply apparatus of a 3D semiconductor, according to another embodiment of the present invention.

FIG. 9 is a cross-sectional view of a power voltage supply apparatus of a 3D semiconductor, according to another embodiment of the present invention. The power voltage supply apparatuses of FIGS. 7 and 9 are structurally symmetrical, and basic principles of the power voltage supply apparatuses of FIGS. 7 and 9 are the same.

Referring to FIG. 9, ICs 210, 220, 230, and 240 each include the first TSV A and the second TSV B for a stacked structure. In FIG. 9, a location of a first PCB line 250 and a location of a second PCB line 260 are switched around compared to FIG. 7. Also, unlike FIG. 7, a first voltage supplied by the first PCB line 250 is a ground voltage GND, and a second voltage supplied by the second PCB line 260 is a power voltage in FIG. 9.

The first PCB line 250 is connected to a bottom (or a lower pad) of the first TSV A4 of the bottom IC 240 through a bump 280. Also, the second PCB line 260 is connected to a top (or an upper pad) of the second TSV B1 of the top IC 210 through a bonding wire 270. Also, a support 290 is disposed in a bottom space of the second TSV B4 of the bottom IC 240.

Figure 10:
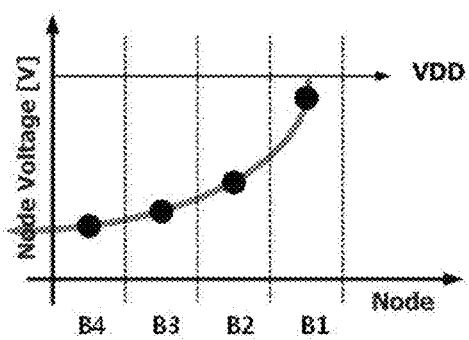
FIG. 10 is diagrams for describing voltage characteristics of each IC according to the power voltage supply apparatus of FIG. 9.
Figure 10:
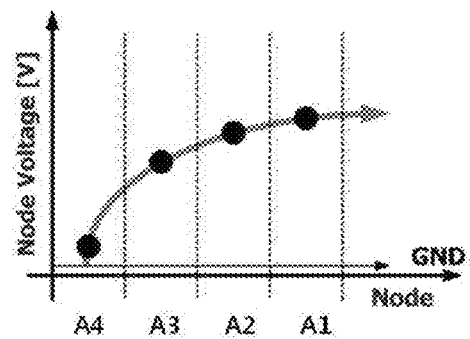

FIG. 10 is diagrams for describing voltage characteristics of each IC according to the power voltage supply apparatus of FIG. 9. FIG. 10(a) is a graph showing the power voltage VDD measured in the nodes B1 through B4 of each IC of FIG. 9, and FIG. 10(b) is a graph showing the ground voltage GND measured in the nodes A1 through A4 of each IC of FIG. 9.

In FIG. 9, since the power voltage VDD is input through the second TSV B1 of the top IC 210, a voltage level of the power voltage VDD is decreased towards the bottom IC 240 as shown in FIG. 10(a). Also, since the ground voltage GND is directly input through the first TSV A4 of the bottom IC 240, a voltage level of the ground voltage GND is increased towards the top IC 210 as shown in FIG. 10(b). Accordingly, although the voltage levels of the power voltage VDD and the ground voltage GND are different according to the ICs 210 through 240, 'a voltage difference between a power voltage and a ground voltage' may be relatively uniformly maintained in each of the ICs 210 through 240.

Figure 11:
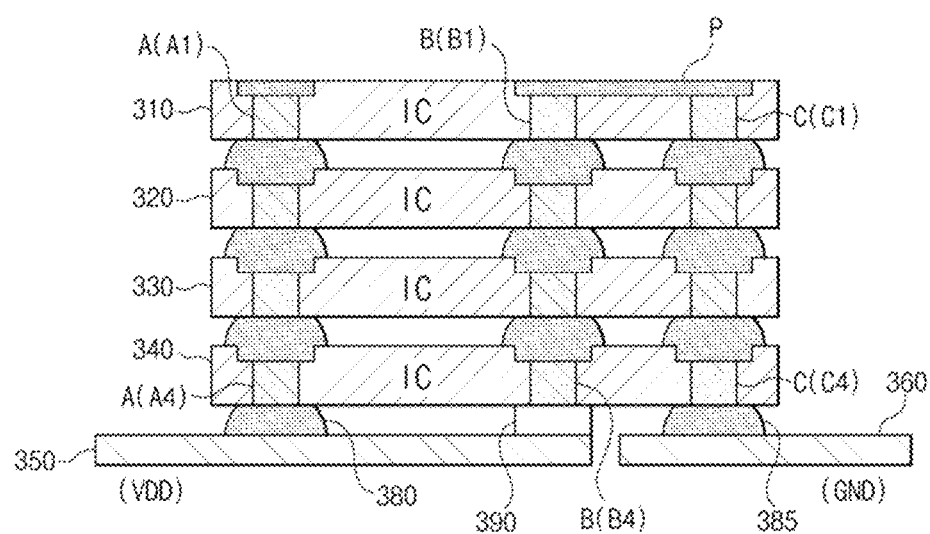
FIG. 11 is a cross-sectional view of a power voltage supply apparatus of a 3D semiconductor, according to another embodiment of the present invention.

FIG. 11 is a cross-sectional view of a power voltage supply apparatus of a 3D semiconductor, according to another embodiment of the present invention. In the current embodiment, a bonding wire is not used.

The power voltage supply apparatus of FIG. 11 is obtained by slightly modifying the power voltage supply apparatus of FIG. 7. In FIG. 11, ICs 310, 320, 330, and 340 each include the first TSV A, the second TSV B, and a third TSV C, and are stacked such that the first TSVs A are connected, the second TSVs B are connected, and the third TSVs C are connected through a bump. Here, pluralities of first TSVs A, second TSVs B, and third TSVs C may be formed in each IC.

A first PCB line 350 for supplying a first voltage and a second PCB line 360 for supplying a second voltage are mounted on the PCB. In FIG. 11, the first voltage supplied by the first PCB line 350 is the power voltage VDD and the second voltage supplied by the second PCB line 360 is the ground voltage GND like FIG. 7.

Here, a top of the first PCB line 350 is connected to a bottom (or a lower pad) of the first TSV A4 of the bottom IC 340 through a bump 380, as described above in FIG. 7. A top of the second PCB line 360 is connected to a bottom (or a lower pad) of a third TSV C4 of the bottom IC 340 through a bump 385.

Also, tops (or upper pads) of the second TSV B1 and third TSV C1 of the top IC 310 are connected to each other by a conductive material. Here, the conductive material corresponds to a conductive pad P connecting the tops of the second and third TSVs B1 and C1 on a top surface of the top IC 310. Like FIG. 7, a support 390 corresponding to a height of the bump 380 is disposed in a space between the PCB and the bottom of the second TSV B4 of the bottom IC 340.

Figure 12:
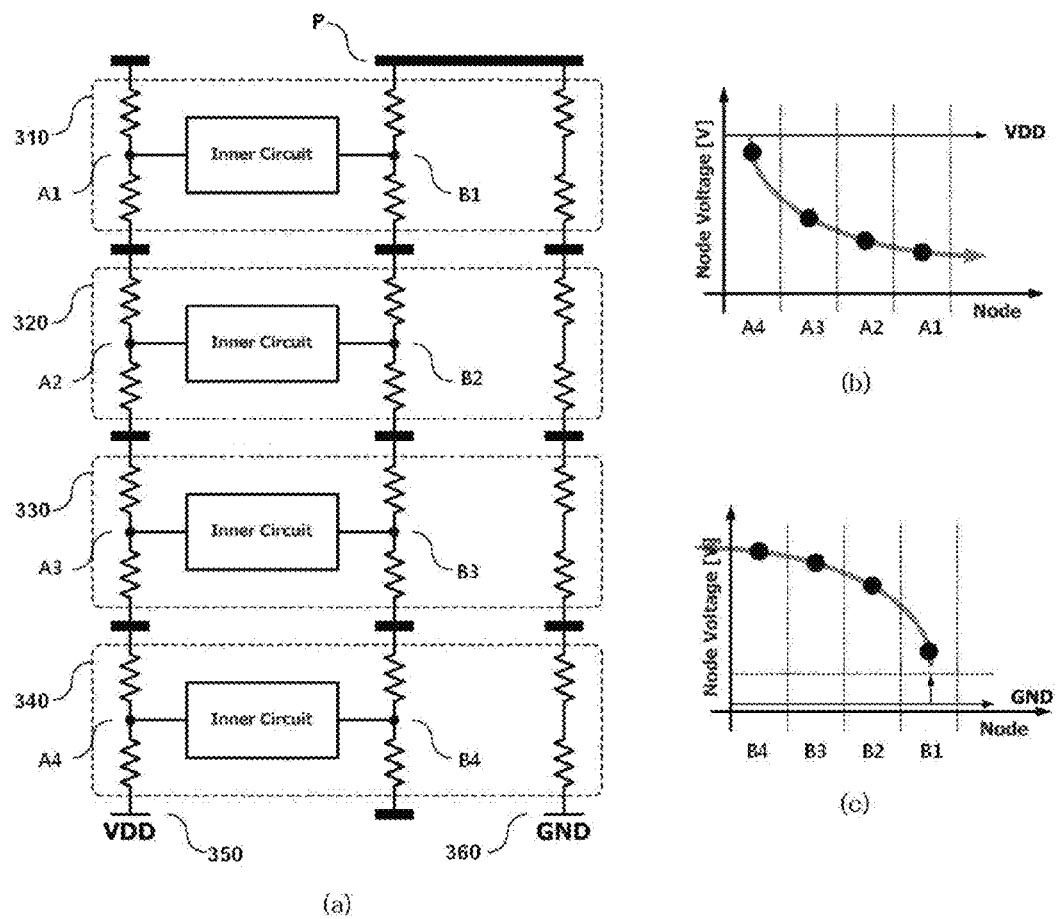
FIG. 12 is diagrams for describing voltage characteristics of each IC according to the power voltage supply apparatus of FIG. 11.

FIG. 12 is diagrams for describing voltage characteristics of each IC according to the power voltage supply apparatus of FIG. 11. FIG. 12(a) is an equivalent circuit of a structure of the power voltage supply apparatus of FIG. 11, wherein reference numerals A1 through A4 and B1 through B4 correspond to nodes of a first TSV portion and a second TSV portion of each layer of FIG. 11. FIG. 12(b) is a graph showing the power voltage VDD measured in the nodes A1 through A4 according to the ICs 310 through 340, and FIG. 12(c) is a graph showing the ground voltage GND measured in the nodes B1 through B4 according to the ICs 110 through 340.

According to the current embodiment, since the power voltage VDD is directly supplied through the bottom IC 340, the voltage level of the power voltage VDD is decreased towards the top IC 310 as shown in FIG. 12(b).

The ground voltage GND is connected from the bottom IC 340 to the top IC 310, and then descends to the bottom IC 340 while connecting ground nodes of the ICs 310 through 340. Here, as shown in FIG. 12(c), a ground terminal of the top IC 310 has the lowest voltage level and a ground terminal of the bottom IC 340 has the highest voltage level.

Also in the current embodiment, although the voltage levels of the power voltage VDD and the ground voltage GND are different according to the ICs 310 through 340, 'a voltage difference between a power voltage and a ground voltage' may be relatively uniformly maintained in each of the ICs 310 through 340. In other words, the power voltage supply apparatus of FIG. 11 has the same characteristics and effects as that of FIG. 7.

However, in FIG. 11, since the ground nodes are first connected from the bottom IC 340 to the top IC 310 before being connected to each IC, the voltage level of the ground voltage GND is increased accordingly throughout the ICs 310 through 340, as shown in FIG. 12(c), wherein a line indicating the ground voltage GND is moved upward (in a direction indicated by an arrow) from a solid line to a dotted line.

Figure 13:
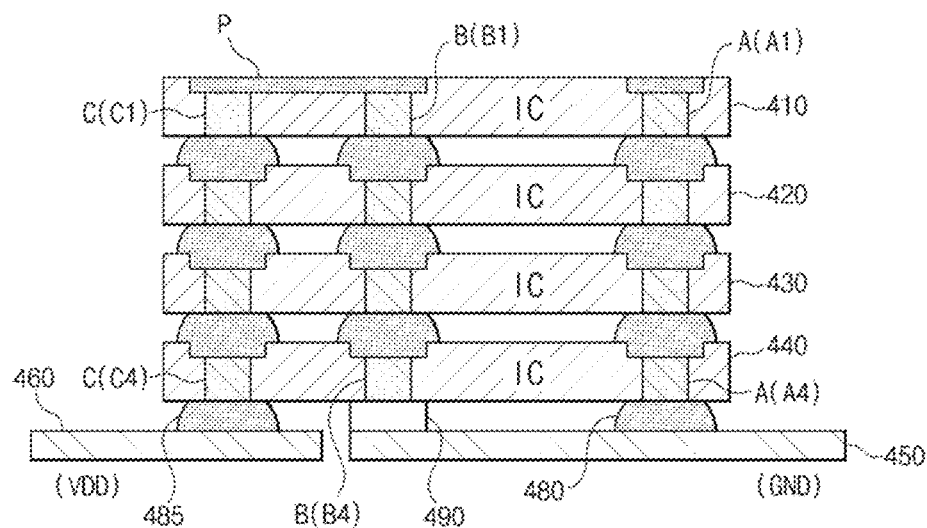
FIG. 13 is a cross-sectional view of a power voltage supply apparatus of a 3D semiconductor, according to another embodiment of the present invention.

FIG. 13 is a cross-sectional view of a power voltage supply apparatus of a 3D semiconductor, according to another embodiment of the present invention. The power voltage supply apparatus of FIG. 13 is structurally symmetrical to that of FIG. 11, and basic principles of the power voltage supply apparatuses of FIGS. 11 and 13 are the same.

ICs 410, 420, 430, and 440 each include the first TSV A, the second TSV B, and the third TSV C for a stacked structure. In the current embodiment, locations of a first PCB line 450 and second PCB line 460 are switched around compared to FIG. 11. Also, unlike FIG. 11, a first voltage supplied by the first PCB line 450 is the ground voltage GND and a second voltage supplied by the second PCB line 460 is the power voltage VDD in FIG. 13.

The first PCB line 450 is connected to a bottom (or a lower pad) of the first TSV A4 of the bottom IC 440 through a bump 480. The second PCB line 460 is connected to a bottom (or a lower pad) of the third TSV C4 of the bottom IC 440 through a bump 485. Also, tops of the second TSV B1 and third TSV C1 of the top IC 410 are connected to each other by the conductive pad P. A support 490 is disposed in a space between a bottom of the second TSV B4 of the bottom IC 440 and the PCB.

Figure 14:
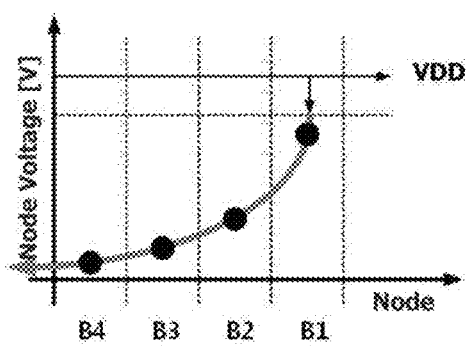
FIG. 14 is diagrams for describing voltage characteristics of each IC according to the power voltage supply apparatus of FIG. 13.
Figure 14:
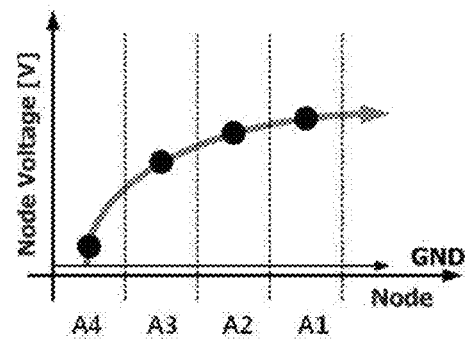

FIG. 14 is diagrams for describing voltage characteristics of each IC according to the power voltage supply apparatus of FIG. 13. FIG. 14(a) is a graph showing the power voltage VDD measured in the nodes C1 through C4 of each IC and FIG. 14(b) is a graph showing the ground voltage GND measured in the nodes A1 through A4 of each IC of FIG. 13.

In the current embodiment, since the ground voltage GND is directly supplied through the bottom IC 440, the voltage level of the ground voltage GND is increased towards the top IC 410 as shown in FIG. 14(b).

The power voltage VDD is connected from the bottom IC 440 to the top IC 410, and then descends to the bottom IC 440 while connecting power nodes of the ICs 410 through 440. Accordingly, as shown in FIG. 14(b), the power voltage VDD of the top IC 410 has the highest voltage level, and the voltage level of the power voltage VDD is decreased towards the bottom IC 440.

In other words, in the current embodiment, although the voltage levels of the power voltage VDD and the ground voltage GND are different according to the ICs 410 through 440, 'a voltage difference between a power voltage and a ground voltage' may be relatively uniformly maintained in each of the ICs 410 through 440. In other words, the power voltage supply apparatus of FIG. 13 has the same characteristics and effects as that of FIG. 9.

However, in FIG. 13, since the power nodes are first connected from the bottom IC 440 to the top IC 410 before being connected to each IC, the voltage level of the power voltage VDD is decreased accordingly throughout the ICs 410 through 440, as shown in FIG. 14(a), wherein a line indicating the power voltage VDD is moved downward (in a direction indicated by an arrow) from a solid line to a dotted line.

Figure 15:
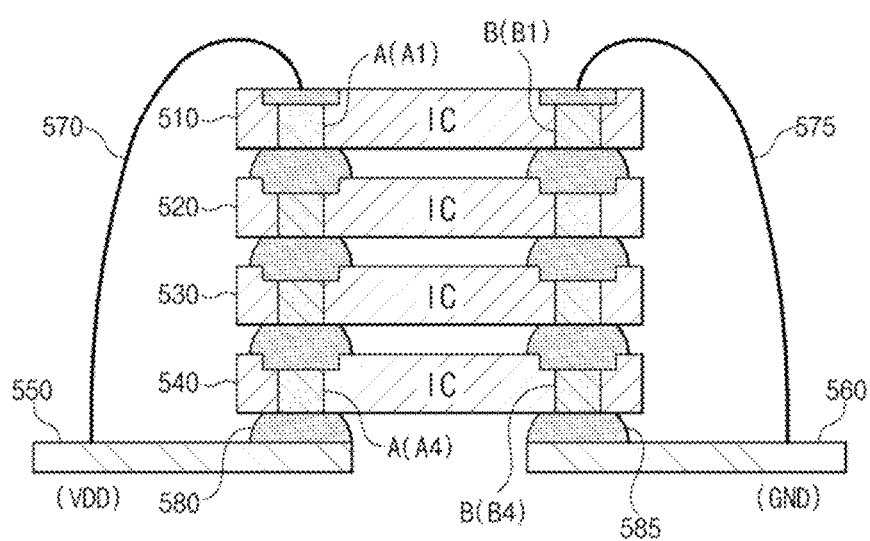
FIG. 15 is a cross-sectional view of a power voltage supply apparatus of a 3D semiconductor, according to another embodiment of the present invention.

FIG. 15 is a cross-sectional view of a power voltage supply apparatus of a 3D semiconductor, according to another embodiment of the present invention. In the current embodiment, a plurality of ICs 510, 520, 530, and 540 are mounted on a PCB (not shown), each include the first TSV A and the second TSV B for a stacked structure, and are stacked such that the first TSVs A are connected and the second TSVs B are connected through a bump.

A first PCB line 550 for supplying a first voltage and a second PCB line 560 for supplying a second voltage are formed on the PCB. In the current embodiment, the first voltage supplied by the first PCB line 550 is the power voltage VDD and the second voltage supplied by the second PCB line 560 is the ground voltage GND, or vice versa.

Here, a top of the first PCB line 550 is connected to a bottom (or a lower pad) of the first TSV A4 of the bottom IC 540 through a bump 580. Also, the first PCB line 550 is connected to a top (or an upper pad) of the first TSV A1 of the top IC 510 through a first wire 570 (a bonding wire).

Similarly, a top of the second PCB line 560 is connected to a bottom (or a lower pad) of the second TSV B4 of the bottom IC 540 through a bump 585. Also, the second PCB line 560 is connected to a top (or an upper pad) of the second TSV B1 of the top IC 510 through a second wire 575 (a bonding wire).

In the current embodiment, both a bonding wire and a TSV are used while connecting the power voltage VDD and the ground voltage GND to the ICs 510 through 540 having the stacked structure, instead of using one of the bonding wire and the TSV as described above in the previous embodiments.

In other words, the power voltage VDD is directly connected to the bottom IC 540 through the first PCB line 550 and also directly connected to the top IC 510 through the first wire 570. Here, the power voltage VDD may be evenly applied to the ICs 510 through 540 having the stacked structure. Similarly, the ground voltage GND is directly connected to the bottom IC 540 through the second PCB line 560 and also directly connected to the top IC 510 through the second wire 575. Here, the ground voltage GND may be evenly applied to the ICs 510 through 540 having the stacked structure.

According to the power voltage supply apparatuses described above, a TSV technology that is one of 3D semiconductor technologies is used and an IC for supplying a power voltage and an IC for supplying a ground voltage are differentiated in ICs having a stacked structure so as to match a voltage difference between the power voltage and the ground voltage on each IC, and thus operational performances of the ICs are the same.

According to the power voltage supply apparatuses of the present invention, operational performances may be increased by matching voltage differences between a power voltage and a ground voltage on ICs having a stacked structure according to a TSV technology.

In other words, by differentiating an IC supplying a power voltage and an IC supplying a ground voltage, voltage differences between the power voltage and the ground voltage in ICs are matched, a difference between operational performances of the ICs is reduced, and an operational performance of an entire system is improved.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A power voltage supply apparatus of a 3-dimensional (3D) semiconductor, the power voltage supply apparatus comprising a plurality of integrated circuits (ICs) which each comprise a first through silicon via (TSV) and a second TSV, are stacked such that first TSVs are connected and second TSVs are connected, and are mounted on a printed circuit board (PCB), wherein a first PCB line formed on the PCB and supplying a first voltage is connected to a bottom of a first TSV of a bottom IC from among the plurality of ICs, and a second PCB line formed on the PCB and supplying a second voltage is connected to a top of a second TSV of a top IC through a wire, wherein the first voltage is one of a power voltage and a ground voltage, and the second voltage is the other of the power voltage and the ground voltage, wherein a top of the first PCB line and the bottom of the first TSV of the bottom IC are connected to each other through a bump, and a support corresponding to a height of the bump is disposed in a space between the bottom of the second TSV of the bottom IC and the PCB, wherein the support is formed of an insulation material, wherein the power voltage supply apparatus has no wire which directly connects a top of a first TSV of the top IC to the first PCB line.

* * * * *